(12) United States Patent
Ando et al.

(10) Patent No.: US 7,444,607 B2
(45) Date of Patent: Oct. 28, 2008

(54) METHOD FOR CORRECTING TIMING ERROR WHEN DESIGNING SEMICONDUCTOR INTEGRATED CIRCUIT

(75) Inventors: Hiroaki Ando, Kasugai (JP); Terumi Yoshimura, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 229 days.

(21) Appl. No.: 11/080,543

(22) Filed: Mar. 16, 2005

(65) Prior Publication Data

US 2006/0117286 A1 Jun. 1, 2006

(30) Foreign Application Priority Data

Nov. 26, 2004 (JP) ............... 2004-342573

(51) Int. Cl.
*G06F 17/50* (2006.01)
*G06F 19/00* (2006.01)

(52) U.S. Cl. ............... 716/6; 716/10; 716/13; 703/16; 703/19

(58) Field of Classification Search ............ 716/5, 716/6, 10, 13; 703/16, 19
See application file for complete search history.

(56) References Cited

U.S. PATENT DOCUMENTS

| | | | |
|---|---|---|---|
| 6,353,917 B1 * | 3/2002 | Muddu et al. ............... 716/6 |
| 6,427,226 B1 * | 7/2002 | Mallick et al. ............... 716/10 |
| 6,651,225 B1 * | 11/2003 | Lin et al. ............... 716/4 |
| 6,990,646 B2 | 1/2006 | Yoshikawa | |
| 7,069,528 B2 * | 6/2006 | Kovacs et al. ............... 716/6 |
| 7,222,318 B2 * | 5/2007 | Srinivasan ............... 716/6 |
| 7,278,126 B2 * | 10/2007 | Sun et al. ............... 716/6 |
| 2001/0007144 A1 * | 7/2001 | Terazawa ............... 716/6 |
| 2003/0088842 A1 * | 5/2003 | Cirit ............... 716/9 |
| 2004/0078765 A1 * | 4/2004 | Cui et al. ............... 716/6 |
| 2004/0088664 A1 * | 5/2004 | Srinivasan ............... 716/6 |
| 2004/0123259 A1 * | 6/2004 | You et al. ............... 716/6 |
| 2005/0010889 A1 * | 1/2005 | Barnes ............... 716/11 |
| 2005/0050496 A1 * | 3/2005 | Kovacs et al. ............... 716/6 |
| 2005/0268263 A1 * | 12/2005 | Sun et al. ............... 716/6 |
| 2006/0031798 A1 * | 2/2006 | Dirks et al. ............... 716/6 |
| 2006/0095871 A1 * | 5/2006 | Levy ............... 716/1 |
| 2006/0117274 A1 * | 6/2006 | Tseng et al. ............... 716/1 |
| 2006/0253823 A1 * | 11/2006 | Matsumura et al. ............ 716/6 |

FOREIGN PATENT DOCUMENTS

| | | |
|---|---|---|
| JP | 2000-250963 | 9/2000 |
| JP | 2001-044287 | 2/2001 |
| JP | 2002-073714 | 3/2002 |
| JP | 2003-162556 | 6/2003 |
| JP | 2003-256488 | 9/2003 |

* cited by examiner

*Primary Examiner*—Phallaka Kik
(74) *Attorney, Agent, or Firm*—Staas & Halsey LLP

(57) ABSTRACT

A method for correcting a timing error in an integrated circuit that includes a plurality of layout blocks with identical configurations in the same hierarchical layer. The method includes matching the tolerance for when a timing error occurs for a cell in each layout block with a worst condition of one of the corresponding cells in the layout blocks, and inserting a timing adjustment cell within a range of the matched tolerance of each cell to adjust the timing error. This method ensures the correction of hold errors and setup errors in an integrated circuit designed with a hierarchical design technique.

15 Claims, 8 Drawing Sheets

METHOD FOR CORRECTING TIMING ERROR WHEN DESIGNING SEMICONDUCTOR INTEGRATED CIRCUIT

CROSS-REFERENCE TO RELATED APPLICATIONS

This application is based upon and claims the benefit of priority from the prior Japanese Patent Application No. 2004-342573, filed on Nov. 26, 2004, the entire contents of which are incorporated herein by reference.

BACKGROUND OF THE INVENTION

The present invention relates to designing of a semiconductor integrated circuit, and more particularly, to a method for correcting a timing error when designing a semiconductor integrated circuit with a hierarchical design technique.

FIG. 1 shows an example of a data transfer circuit designed with a hierarchical design technique. In FIG. 1, layout blocks 1a and 1b are designed beforehand for a layer lower than the data transfer circuit.

The uppermost hierarchical layer in the data transfer circuit includes the two layout blocks 1a and 1b, four flip flop circuits FF1 to FF4, and six cells c1 to c6. The layout block 1a includes three single-input cells c7 to c9, a multiple-input cell c10, and four flip flop circuits FF01 to FF04. The layout block 1b includes three single-input cells c11 to c13, a multiple-input cell c14, and four flip flop circuits FF05 to FF08.

The flip flop circuits FF1 to FF4 and FF01 to FF08 each input and output data in accordance with a clock signal. In FIG. 1, the clock signal is not shown.

The data provided from the flip flop circuit FF1 is sent via the cells c3, c2, c7, and c9 to the flip flop circuits FF02 and FF03 and via the cells c3, c2, c7, c8, and c10 to the flip flop circuit FF01. The data provided from the flip flop circuit FF3 is sent via the cell c1 to the flip flop circuit FF04 and via the cells c1 and c10 to the flip flop circuit FF01.

The data provided from the flip flop circuit FF4 is sent via the cells c4, c5, and c6 to the flip flop circuit FF08 and via the cells c4, c5, c6, and c14 to the flip flop circuit FF05. The data provided from the flip flop circuit FF2 is sent via the cells c11, c12, and c14 to the flip flop circuit FF05 and via the cells c11 and c13 to the flip flop circuits FF06 and FF07.

The numbers marked at opposite ends of the cells c1 to c14 and the numbers marked at the input ends of the flip flop circuits FF01 to FF08 each indicate a delay margin time Slack until a set up timing error occurs in the cells c1 to c14 and the flip flop circuits FF01 to FF08. The unit of the delay margin time Slack is ps. Further, the delay margin time Slack of each of the multiple-input cells c10 and c14 is set in accordance with the delay margin time Slack of the input pin that is under a harsher condition.

FIG. 2 shows the hold time and the setup time of a flip flop circuit. In the flip flop circuit FF shown in FIG. 2(a), when data DATA is retrieved in response to the rising edge of the clock signal CLK, a setup time ST that is longer than or equal to a predetermined time must be provided from when the data DATA that is to be retrieved is input to when the clock signal goes high, as shown in FIG. 2(c). Further, a hold time HT that is longer than or equal to a predetermined time must be provided from when the clock signal CLK goes high to when the input of the data DATA that is to be retrieved ends, as shown in FIG. 2(c). A setup timing error occurs when the setup time ST cannot be provided, and a hold timing error occurs when the hold time HT cannot be provided.

For example, in pass A extending from the flip flop circuit FF3 to the flip flop circuit FF01, when a hold error occurs in the flip flop circuit FF01, the adjustment time, or the data delay time required to correct the hold error is 45 ps. In pass B extending from the flip flop circuit FF1 to the flip flop circuit FF01, when a hold error occurs in the flip flop circuit FF01, the adjustment time, or the data delay time required to correct the hold error is 140 ps. In pass C extending from the flip flop circuit FF2 to the flip flop circuit FF06, when a hold error occurs in the flip flop circuit FF06, the adjustment time, or the data delay time required to correct the hold error is 120 ps.

Japanese Laid-Open Patent Publication Nos. 2003-162556, 2003-256488, and 2000-250963 each describe a method for correcting a hold error such as that described-above.

SUMMARY OF THE INVENTION

When designing recent larger scale semiconductor integrated circuits with a hierarchical technique, it is desired that the number of operations required to correct an operation timing error, such as a hold timing error or a setup timing error, be reduced to sufficiently reduce the total number of design operations.

The present invention provides a timing error correction method that ensures the elimination of hold errors and setup errors in an integrated circuit designed with a hierarchical design technique.

One aspect of the present invention is a method for correcting a timing error in an integrated circuit that includes a plurality of layout blocks in the same hierarchical layer. Each layout block has a cell corresponding to a cell of another layout block, the cell of each layout block having a tolerance for when a timing error occurs. The method includes determining a worst condition and one of the corresponding cells that has the worst condition, matching the tolerance of the corresponding cells in layout blocks with the worst condition of the determined one of the corresponding cells, and inserting a timing adjustment cell within a range of the matched tolerance of each cell to adjust the timing error.

Another aspect of the present invention is a method for correcting a hold error in an integrated circuit that includes a plurality of layout blocks with identical configurations in the same hierarchical layer. Each layout block includes a cell corresponding to a cell of another layout block. The cell of each layout block has a tolerance for when a setup error occurs. The method includes determining a worst condition and one of the corresponding cells that has the worst condition, matching the tolerance of the corresponding cells in layout blocks with the worst condition of the determined one of the corresponding cells, and inserting a delay cell in each layout block within a range of the matched tolerance of the corresponding cells in each layout block to adjust the hold error.

A further aspect of the present invention is a method for correcting a timing error in an integrated circuit that includes a plurality of layout blocks with identical configurations in the same hierarchical layer. Each layout block includes a path. The method includes specifying a layout block, among the plurality of layout blocks, including a path having a timing error. Further, the method includes inserting a timing adjustment cell in the specified layout block to adjust the timing error.

Another aspect of the present invention is a method for correcting a hold error in an integrated circuit that includes a plurality of layout blocks with identical configurations in the same hierarchical layer. Each layout block includes a path. The method includes specifying a layout block, among the plurality of layout blocks, including a path having a hold error. Further, the method includes inserting a delay cell in the specified layout block to adjust the hold error.

Still a further aspect of the present invention is a method for correcting a timing error in an integrated circuit that includes a plurality of layout blocks with identical configurations in the same hierarchical layer. Each layout block has a cell, corresponding to a cell of another layout block, and a path of the cell. The cell of each layout block has a tolerance for when a timing error occurs. The method includes determining the number of layout blocks, among the plurality of layout blocks, including a path having a timing error and whether the number of layout blocks is relatively large or small. If the number of layout blocks is relatively large, the method determines a worst condition and one of the corresponding cells that has the worst condition, and matches the tolerances of the corresponding cells in layout blocks with the worst condition of the determined one of the corresponding cells. The method further includes inserting a timing adjustment cell within a range of the matched tolerance of each cell to adjust the timing error. If the number of layout blocks is relatively small, the method specifies the layout block including a path having a timing error. Further, the method includes inserting a timing adjustment cell in the specified layout block to adjust the timing error.

Still another aspect of the present invention is a method for correcting a hold error in an integrated circuit that includes a plurality of layout blocks with identical configurations in the same hierarchical layer. Each layout block has a cell, corresponding to a cell of another layout block, and a path of the cell. The cell of each layout block has a tolerance for when a setup error occurs. The method includes determining the number of layout blocks, among the plurality of layout blocks, including a path having a timing error and whether the number of layout blocks is relatively large or small. If the number of layout blocks is relatively large, the method determines a worst condition and one of the corresponding cells that has the worst condition, and matches the tolerances of the corresponding cells in layout blocks with the worst condition of the determined one of the corresponding cells. The method further includes inserting a delay cell within a range of the matched tolerance of the corresponding cells in each layout block to adjust the hold error. If the number of layout blocks is relatively small, the method specifies the layout block, among the plurality of layout blocks, that includes a path having a hold error. Further, the method includes inserting a delay cell in the specified layout block to adjust the hold error.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
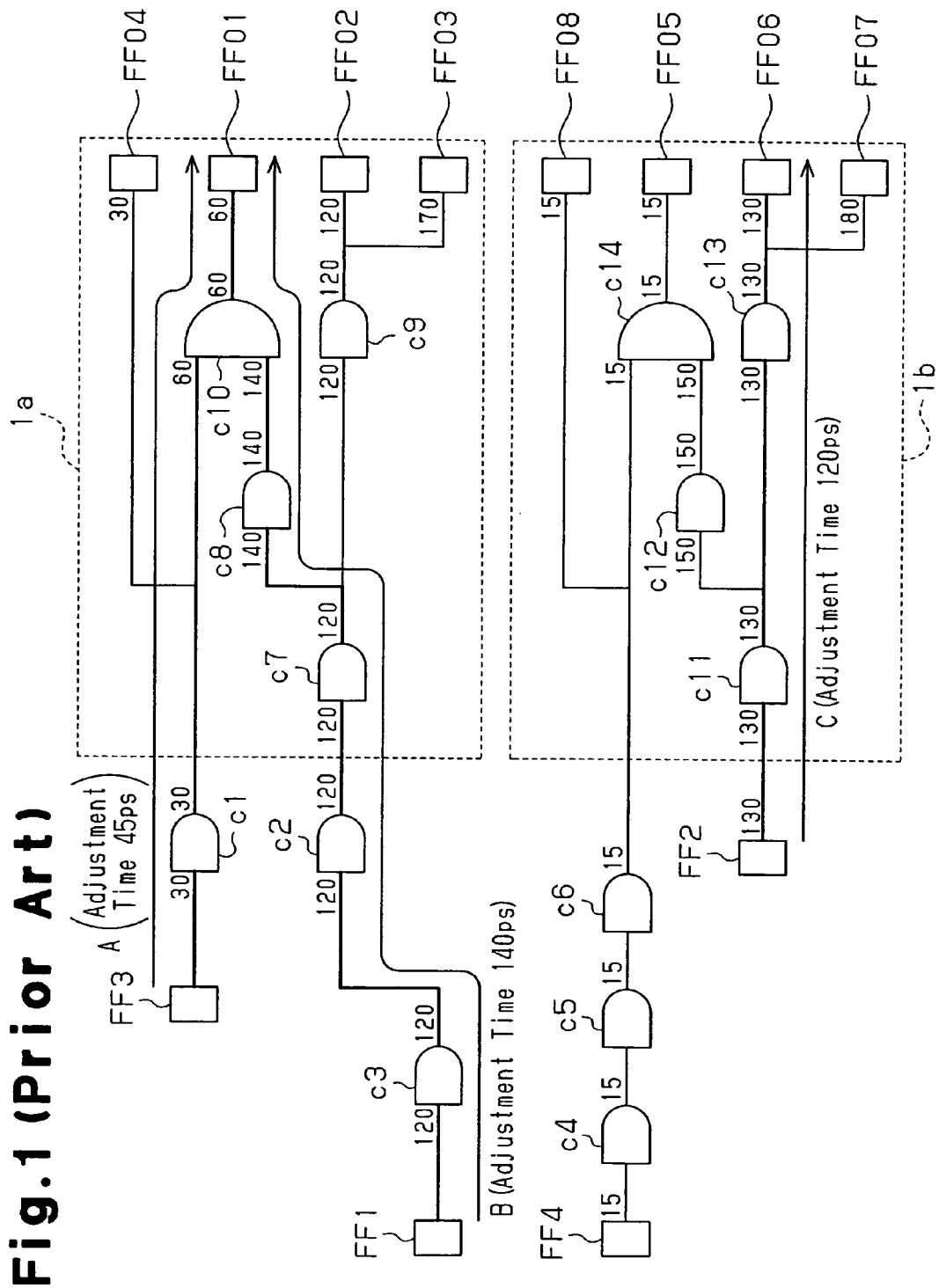
FIG. 1 is a schematic block diagram of a data transfer circuit in the prior art.
Figure 2A:
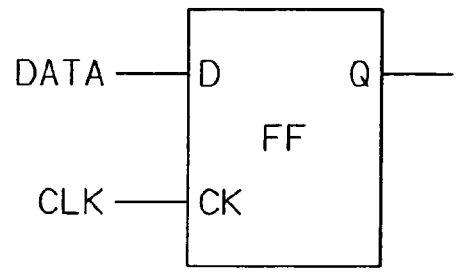
FIG. 2(a) is a schematic block diagram of a flip flop circuit.
Figure 2B:
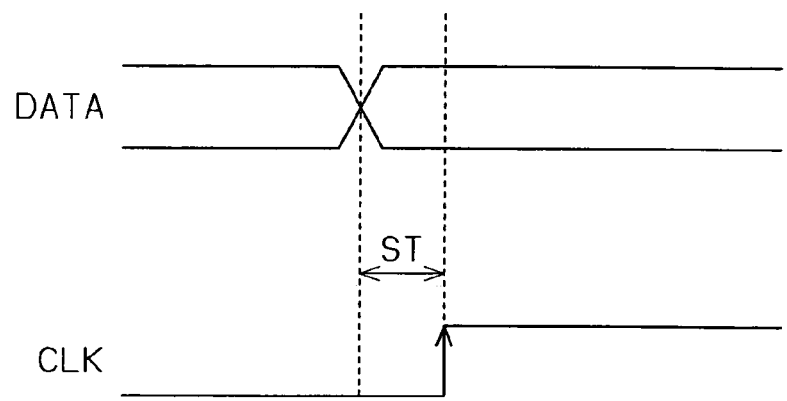
FIG. 2(b) is a waveform chart illustrating the setup time of the flip flop circuit of FIG. 2(a)
Figure 2C:
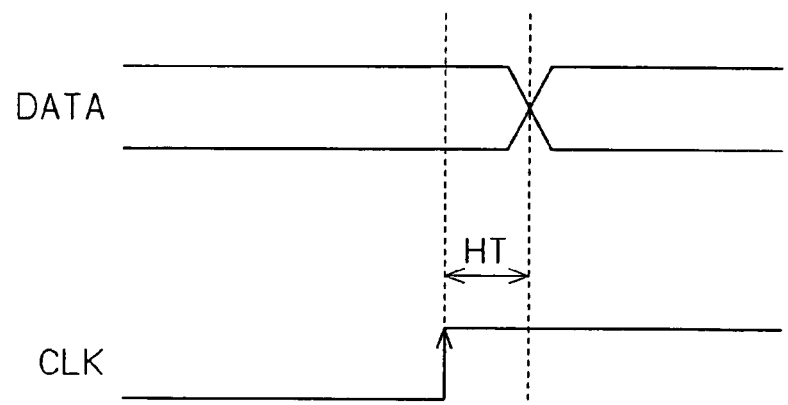
FIG. 2(c) is a waveform chart illustrating the hold time of the flip flop circuit shown in FIG. 2(a)

In the drawings, like numerals are used for like elements throughout.

Before describing a timing error correction method according to a preferred embodiment of the present invention, a timing error correction method of the prior art performed when a hold error occurs in the circuit configuration of FIG. 1 will be described.

Figure 3:
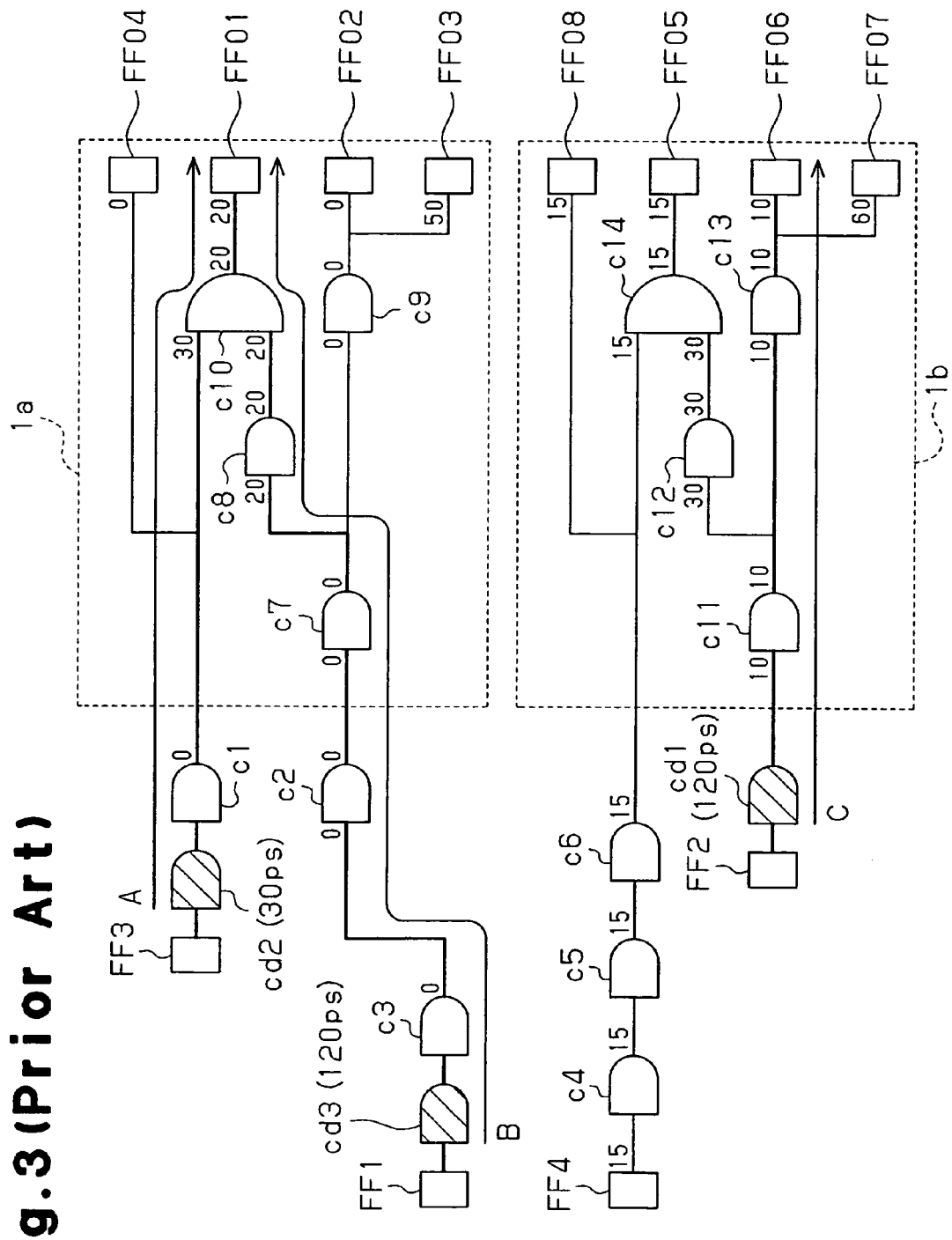
FIG. 3 is a schematic block diagram of a data transfer circuit illustrating a timing error correction method in a first prior art example.

A first example of a timing error correction method in the prior art that eliminates such a hold error is shown in FIG. 3. In the first example, a delay cell is inserted only in the uppermost hierarchical layer. To eliminate a hold error in pass C, a delay cell cd1 having a delay time of 120 ps is inserted between the flip flop circuit FF2 and the cell c11. This ensures the set up time in the flip flop circuit F06 and eliminates hold errors.

However, for example, if a delay cell cd2 having a delay time of 30 ps is inserted between the flip flop circuit FF3 and the cell c1 in pass A, the delay margin time Slack of the flip flop circuit FF04 becomes zero. Thus, the insertion of a delay cell having a delay time of 30 ps or longer causes a setup timing error to occur in the flip flop circuit FF04. Accordingly, in this example, hold errors cannot be eliminated from pass A without causing a setup error to occur in the flip flop circuit FF04.

Further, for example, if a delay cell cd3 having a delay time of 120 ps is inserted between the flip flop circuit FF1 and the cell c3 in pass B, the delay margin time Slack of the flip flop circuit FF02 becomes zero. Thus, the insertion of a delay cell having a delay time of 120 ps or longer causes a setup timing error to occur in the flip flop circuit FF02. Accordingly, in this example, hold errors cannot be eliminated from pass A without causing a setup error to occur in the flip flop circuit FF02.

Figure 4:
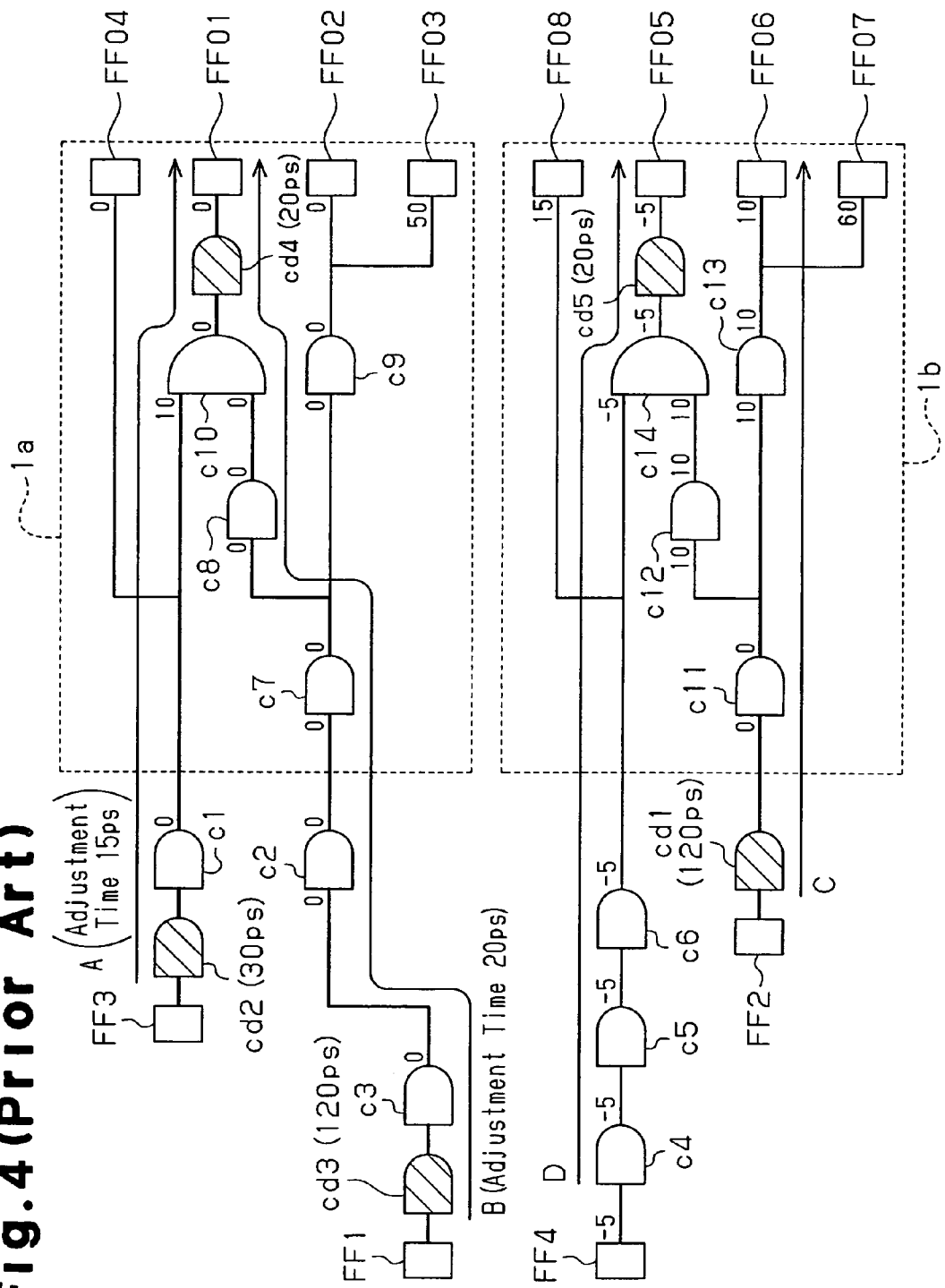
FIG. 4 is a schematic block diagram of a data transfer circuit illustrating a timing error correction method in a second prior art example.

A second example of a timing error correction method in the prior art that eliminates the above-described hold error by inserting further delay cells in the layout blocks 1a and 1b is shown in FIG. 4. As shown in FIG. 4, in addition to the delay cells cd1 to cd3, delay cells cd4 and cd5 having a delay time of 20 ps are inserted in the layout blocks 1a and 1b. The layout blocks 1a and 1b are designed with identical configurations before the uppermost hierarchical layer is designed. Thus, when the delay cd4 having a delay time of 20 ps is inserted between the cell c10 and the flip flop circuit FF01 in the layout block 1a, an identical delay cell cd5 is inserted between the cell c14 and the flip flop circuit FF05 in the layout block 1b.

When performing such an adjustment, the delay cells cd2 and cd4 in pass A ensure a delay time of 50 ps, which is longer than or equal to 45 ps. Thus, an adjustment time of 45 ps is ensured while eliminating hold errors, and setup errors do not occur in the ff circuit FF04. Further, the delay cells cd3 and cd4 in pass B ensure a delay time of 140 ps. Thus, an adjustment time of 140 ps is ensured while eliminating hold errors. The insertion of the delay cell cd5 in pass C has no effect. Thus, in the same manner as in example 1, hold errors are eliminated.

However, in pass D, which extends from flip flop circuits FF4 to FF05, the delay cell cd5 having a delay time of 20 ps is inserted for the flip flop circuit FF05 having a delay margin time Slack of 15 ps. Thus, the delay time Slack of the flip flop circuit FF05 takes a negative value. This results in the occurrence of a setup error. When adjusting hold errors with such a hierarchical design technique, hold errors cannot be eliminated even when delay cells are inserted in the uppermost hierarchical layer.

Further, when a plurality of layout blocks having identical configurations are used in the uppermost hierarchical layer, the insertion of a delay cell in one of the layout blocks results in the insertion of identical delay cells in all of the other layout blocks. This results in the occurrence of setup errors in the paths extending through the other layout blocks and increases the number of operations for re-adjusting these layout blocks.

Figure 5:
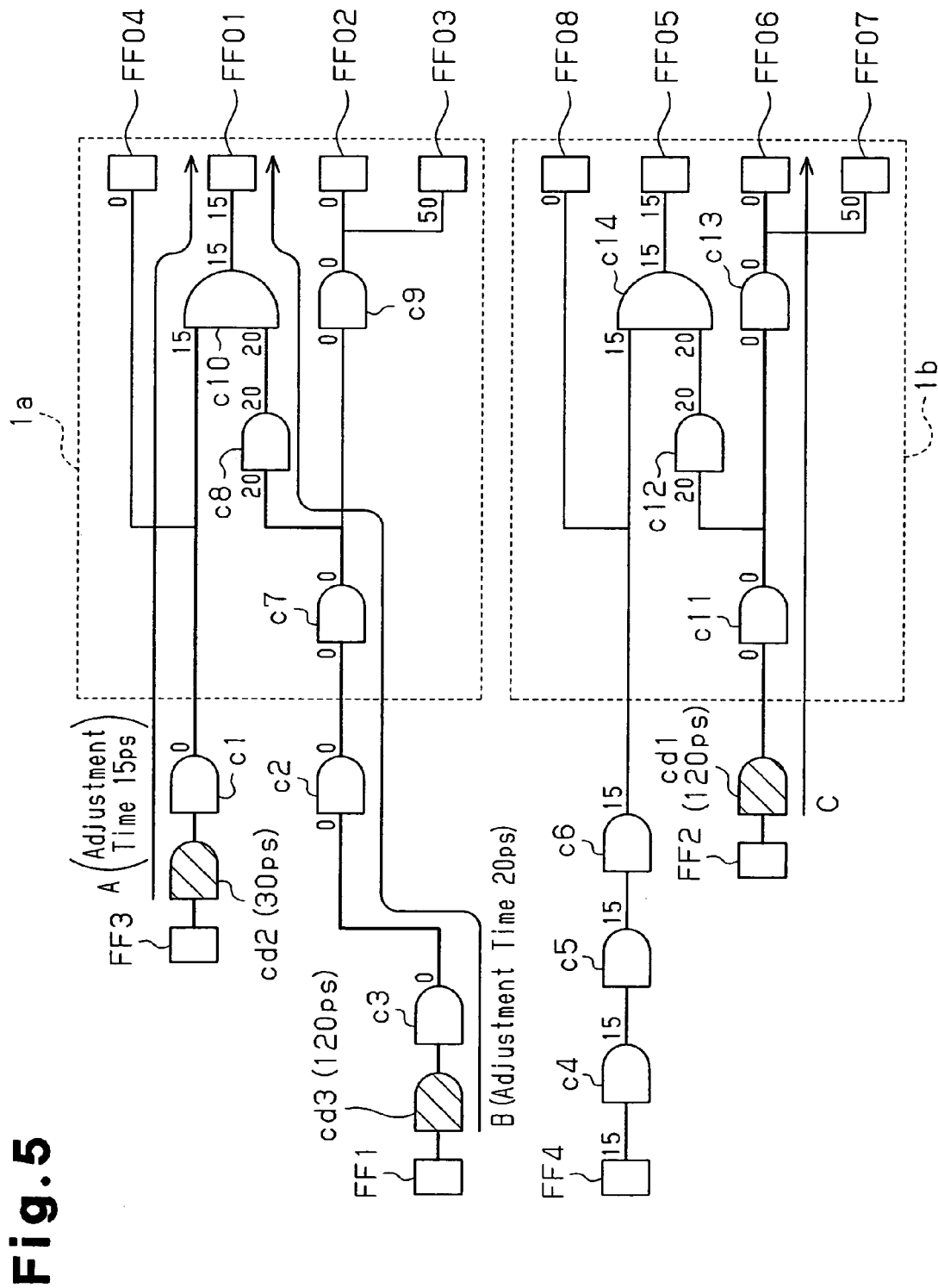
FIG. 5 is a schematic block diagram of a data transfer circuit illustrating a timing error correction method according to a preferred embodiment of the present invention.

An adjustment method for hold errors according to a preferred embodiment of the present invention will now be described. FIG. 5 shows a state in which delay cells (timing adjustment cells) cd1, cd2, and cd3 are inserted in the same manner as in FIG. 3 to eliminate hold errors in the prior art example of FIG. 1.

A delay time of 45 ps is necessary to eliminate hold errors in path A. However, a delay cell cd2 having the maximum delay time 30 ps of the range in which the occurrence of setup errors are prevented is inserted in path A. Accordingly, hold errors are not eliminated in path A and a further adjustment time of 15 ps is necessary.

To eliminate hold errors, path B requires a delay time of 140 ps. However, a delay cell cd3 having the maximum delay time 120 ps of the range in which the occurrence of setup errors are prevented is inserted in path B. Accordingly, hold errors are not eliminated in path B and a further adjustment time of 20 ps is necessary.

In the preferred embodiment, to eliminate the hold errors of paths A and B, the following process is performed. In a state in which the delay cells cd1, cd2, and cd3 are inserted, the delay margin time Slack (delay margin time until a setup error occurs, that is, tolerance) of the cells in the layout blocks 1a and 1b shown in FIG. 3 is matched with the worst condition in one of the corresponding cells in the layout blocks 1a and 1b.

More specifically, the delay margin time Slack for the cells c7 and c11 is matched with "0", which is the delay margin time Slack of cell c7. The delay margin time Slack for the cells c8 and c12 is matched with "20", which is the delay margin time Slack of cell c8. The delay margin time Slack for the cells c9 and c13 is matched with "0", which is the delay margin time Slack of cell c9. Further, the delay margin times Slack of the cells c10 and c14 are set to "15" and "20" to be matched with the worst condition in one of the corresponding cell pins. In other words, the first cell pins of the cells c10 and c14 are matched with "15", which is the delay margin time of the first cell pin in the cell c14. Further, the second cell pins of the cells c10 and c14 are matched with "20", which is the delay margin time of the second cell pin in the cell c10.

The flip flop circuits FF01 to FF08 are matched with the worst condition in one of the corresponding flip flop circuits. That is, the delay margin time Slack for the flip flop circuits FF01 and FF05 is matched with "15", and the delay margin time Slack for the flip flop circuits FF02 and FF06 is matched with "0". Further, the delay margin time Slack for the flip flop circuits FF03 and FF07 is matched with "50", and the delay margin time Slack for the flip flop circuits FF04 and FF08 is matched with "0".

Through such processing, corresponding cells have the matched delay margin time Slack in the layout blocks 1a and 1b.

Figure 6:
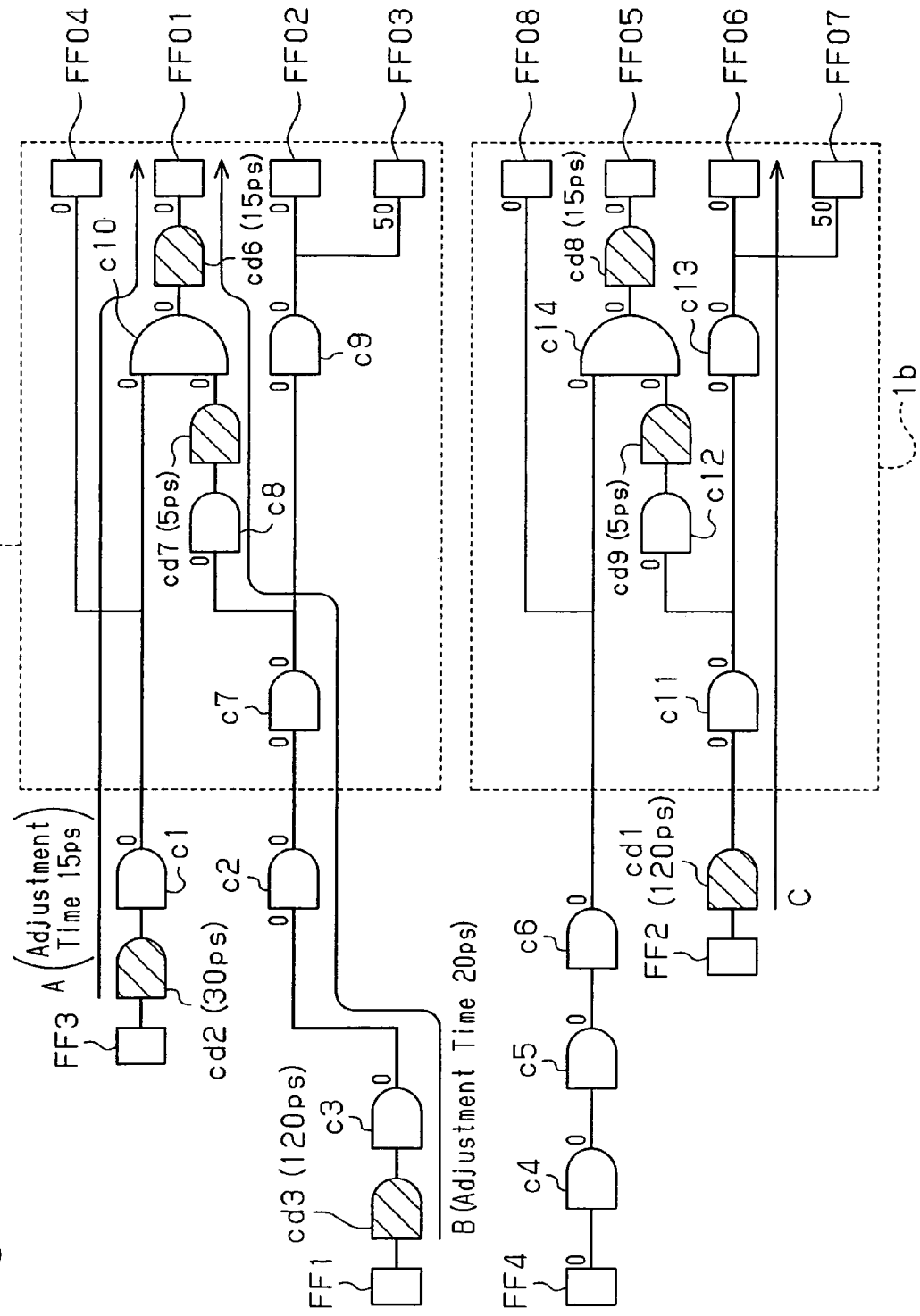
FIG. 6 is a schematic block diagram of a data transfer circuit illustrating a timing error correction method according to the preferred embodiment of the present invention.

Then, to eliminate hold errors from the paths A and B, delay cells are inserted in each layout block. When doing so, the delay cells are inserted so that the delay margin time Slack does not become less than "0" in each layout block. More specifically, referring to FIG. 6, in the layout block 1a, a delay cell cd6 having a delay time of 15 ps is inserted between the cell c10 and the flip flop circuit FF01, which adds a delay time of 15 ps to path A and eliminates hold errors. Furthermore, a delay cell cd7 having a delay time of 5 ps is inserted between the cell c8 and the cell c10, which adds a delay time of 20 ps to path B and eliminates hold errors. In this state, delay cells cd8 and cd9 are also inserted in the layout block 1b. However, there is no path in which a delay margin time Slack of "0" exists. Thus, a setup error does not occur. Accordingly, by performing the above process, the occurrence of setup errors is prevented, while eliminating hold errors in every path.

In the above-described process, the same delay cell is inserted in every layout block. However, when a hold error occurs in only some of a plurality of layout blocks, delay cells are inserted in only the layout blocks having hold errors so that such layout blocks are configured differently from the other layout blocks.

Figure 7:
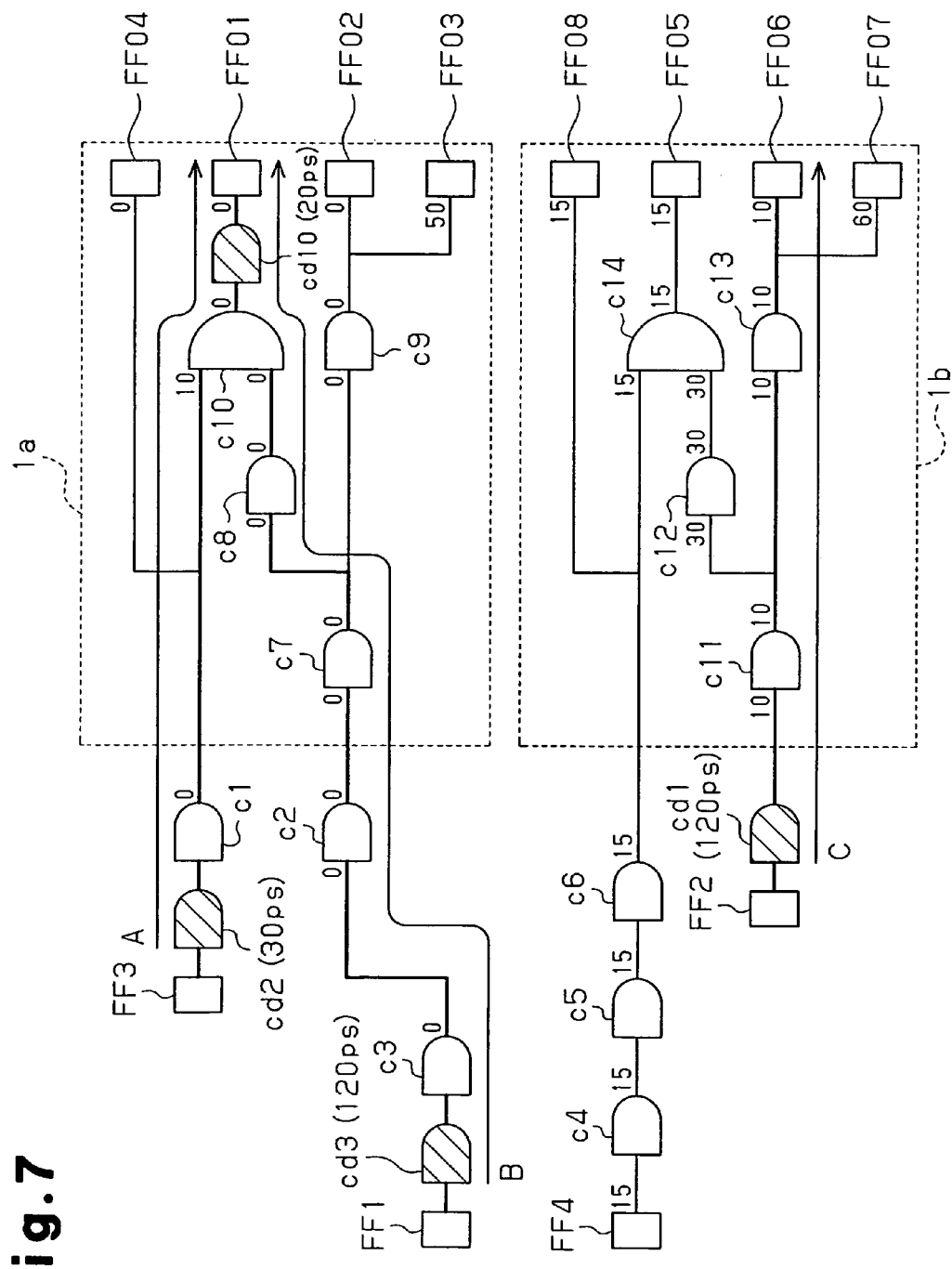
FIG. 7 is a schematic block diagram of a data transfer circuit illustrating a timing error correction method according to the preferred embodiment of the present invention.

Referring to FIG. 3, when the delay cells cd1, cd2, and cd3 are inserted and hold errors are eliminated from path C of the layout block 1b, if hold errors are not eliminated from only paths A and B of the layout block 1a, a delay cell cd10 is inserted only in the layout block 1a as shown in FIG. 7. That is, when the delay cell cd10, which has a delay time of 20 ps is inserted between the cell c10 and the flip flop circuit FF01, the hold errors in both of the paths A and B are eliminated and setup errors do not occur.

Figure 8:
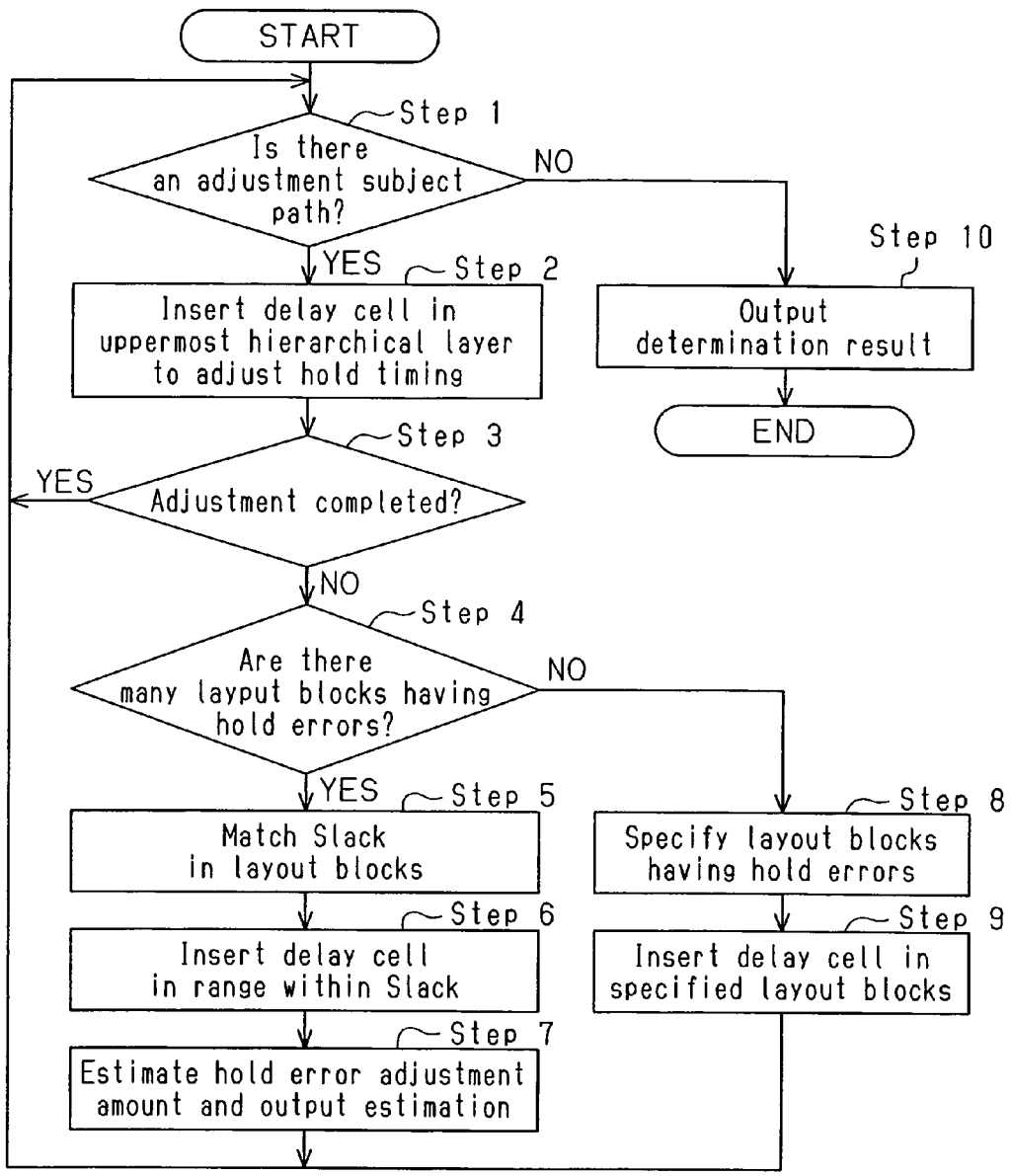
FIG. 8 is a flowchart illustrating a timing error correction method according to the preferred embodiment of the present invention.

When designing an integrated circuit with a layout device, the above two methods are selectively used in accordance with the state of the path in which a hold error is occurring. An adjustment method for the hold error will now be discussed with reference to FIG. 8.

When the layout of an uppermost hierarchical layer ends and the adjustment of a hold error is started, it is determined whether or not a path having a hold error exists. That is, it is determined whether or not a path subject to adjustment exists (step 1).

When it is determined in step 1 that there is an adjustment subject, a delay cell is inserted in the uppermost hierarchical layer, as shown in FIG. 5, to adjust the hold timing (step 2).

Then, it is determined whether the process of step 2 has eliminated hold errors from every path (step 3). If hold errors are eliminated from every path in step 3, the processing returns to step 1.

When the hold errors are not eliminated, the following process is selected in accordance with the state of the path having a hold error (step 4). When there are hold errors in a relatively large number of layout blocks, the processing proceeds to step 5 to perform the steps shown in FIGS. 5 and 6. More specifically, the delay margin times Slack of the cell pins of corresponding cells in the layout blocks are compared to match the delay margin time Slack with the worst condition in one of the corresponding cells. Then, a delay cell in inserted in the layout blocks within a range that does not exceed the matched delay margin time to adjust the hold error (step 6). Subsequently, the adjustment amount of the hold errors is estimated, and the result is output (step 7). The processing then returns to step 1.

In step 4, when there are hold errors in only a relatively small number of layout blocks, the processing proceeds to step 8 to perform the steps shown in FIG. 7. That is, only the layout blocks having hold errors are specified and delay cells are inserted only in those layout blocks (step 9). The processing then returns to step 1.

In step 1, when a path subject to adjustment does not exist, this determination result is output (step 10), and the hold error adjustment process is completed.

The adjustment method for hold errors in the preferred embodiment has the advantages described below.

(1) If hold errors cannot be eliminated even when delay cells are inserted in the uppermost hierarchical layer to adjust hold errors, delay cells are inserted in layout blocks used in the uppermost hierarchical layer. This eliminates hold errors without causing setup errors.

(2) When delay cells are inserted in the layout blocks, the delay margin time Slack is set in accordance with the one of the corresponding cells in the layout blocks having the worst condition. In this state, delay cells are inserted in a range in which the delay margin time Slack of each cell does not become less than "0". Accordingly, the insertion process of delay cells is easily performed without causing setup errors, while eliminating hold errors.

(3) When the number of layout blocks including paths having hold errors is relatively small, such layout blocks are specified, and delay cells are inserted in the specified layout blocks. Accordingly, the number of design operations is reduced in comparison to when delay cells are inserted in every layout block.

It should be apparent to those skilled in the art that the present invention may be embodied in many other specific forms without departing from the spirit or scope of the invention. Particularly, it should be understood that the present invention may be embodied in the following forms.

In the above embodiment, delay cells are inserted to adjust hold errors. However, the present invention may also be applied when repeater cells or driver cells are inserted to adjust the transfer timing of data within a range in which hold errors do not occur.

The present examples and embodiments are to be considered as illustrative and not restrictive, and the invention is not to be limited to the details given herein, but may be modified within the scope and equivalence of the appended claims.

What is claimed is:

1. A method for correcting a timing error in an integrated circuit that includes a plurality of layout blocks including first and second layout blocks in a same hierarchical layer, wherein the first layout block has a first cell corresponding to a second cell of the second layout block, each of the first and second cells having a tolerance for when a timing error occurs, the method comprising:
   determining a worst condition and one of the first and second cells that has the worst condition;
   matching the tolerances of the first and second cells in the first and second layout blocks with the worst condition of the determined one of the first and second cells; and
   inserting a timing adjustment cell within a range of the matched tolerance of first and second cells to adjust the timing error.

2. The method according to claim 1, wherein said inserting a timing adjustment cell includes inserting a timing adjustment cell in each of the first and second layout blocks within a range of the matched tolerance of the first and second cells, the method further comprising:
   inserting another timing adjustment cell outside each of the first and second layout blocks.

3. The method according to claim 1, wherein each of the first and second layout blocks includes a plurality of paths for a single cell, said inserting a timing adjustment cell includes inserting a timing adjustment cell in each of the paths of each of the first and second layout blocks within a range of the matched tolerance of the first and second cells.

4. A method for correcting a hold error in an integrated circuit that includes a plurality of layout blocks including first and second layout blocks with identical configurations in a same hierarchical layer, wherein the first layout block includes a first cell corresponding to a second cell of the second layout block, each of the first and second cells having a tolerance for when a setup error occurs, the method comprising:
   determining a worst condition and one of the first and second cells that has the worst condition;
   matching the tolerances of the first and second cells in the first and second layout blocks with the worst condition of the determined one of the first and second cells; and
   inserting a delay cell in each of the first and second layout blocks within a range of the matched tolerance of the first and second cells in the first and second layout blocks to adjust a hold error.

5. The method according to claim 4, further comprising:
   inserting another delay cell outside each of the first and second layout blocks.

6. The method according to claim 4, wherein each of the first and second layout blocks includes a plurality of paths for a single cell in each of the first and second layout blocks, said inserting a delay cell includes inserting a delay cell in each of the paths of each of the first and second layout blocks within a range of the matched tolerance of the first and second cells.

7. A method for correcting a timing error in an integrated circuit that includes a plurality of layout blocks with identical configurations in a same hierarchical layer, wherein each layout block includes a path, the method comprising:
   determining whether timing error occurs in a relatively small number of layout blocks;
   specifying a layout block, among the plurality of layout blocks, including a path having a timing error if it is determined that there are timing errors in a relatively small number of layout blocks; and
   inserting a timing adjustment cell in the specified layout block to adjust a timing error.

8. The method according to claim 7, further comprising:
   inserting another timing adjustment cell outside each layout block.

9. The method according to claim 8, wherein said specifying a layout block includes, when there is a layout block including a path having a timing error after inserting another timing adjustment cell, specifying that layout block.

10. A method for correcting a hold error in an integrated circuit that includes a plurality of layout blocks with identical configurations in a same hierarchical layer, wherein each layout block includes a path, the method comprising:
   determining whether hold error occurs in a relatively small number of layout blocks;
   specifying a layout block, among the plurality of layout blocks, including a path having a hold error if it is determined that there are hold errors in a relatively small number of layout blocks; and inserting a delay cell in the specified layout block to adjust a hold error.

11. The method according to claim 10, further comprising: inserting another timing adjustment cell outside each layout block.

12. The method according to claim 11, wherein said specifying a layout block includes, when there is a layout block including a path having a timing error after inserting another timing adjustment cell, specifying that layout block.

13. A method for correcting a timing error in an integrated circuit that includes a plurality of layout blocks with identical configurations in a same hierarchical layer, wherein each layout block has a cell, corresponding to a cell of another layout block, and a path of the cell, the cell of each layout block having a tolerance for when a timing error occurs, the method comprising:

determining a number of layout blocks, among the plurality of layout blocks, including a path having a timing error and whether the number of layout blocks is relatively large or small;

if the number of layout blocks is relatively large:

determining a worst condition and one of corresponding cells that has the worst condition, and matching tolerances of corresponding cells in layout blocks with the worst condition of the determined one of the corresponding cells; and inserting a timing adjustment cell within a range of the matched tolerance of each cell to adjust the timing error;

if the number of layout blocks is relatively small;

specifying the layout block including a path having a timing error; and inserting a timing adjustment cell in the specified layout block to adjust the timing error.

14. A method for correcting a hold error in an integrated circuit that includes a plurality of layout blocks with identical configurations in a same hierarchical layer, wherein each layout block has a cell, corresponding to a cell of another layout block, and a path of the cell, the cell of each layout block having a tolerance for when a setup error occurs, the method comprising:

determining a number of layout blocks, among the plurality of layout blocks, including a path having a timing error and whether the number of layout blocks is relatively large or small;

if the number of layout blocks is relatively large:

determining a worst condition and one of the corresponding cells that has the worst condition, and matching tolerances of corresponding cells in layout blocks with the worst condition of the determined one of corresponding cells; and inserting a delay cell within a range of the matched tolerance of the corresponding cell in each layout block to adjust a hold error;

if the number of layout blocks is relatively small:

specifying the layout block, among the plurality of layout blocks, that includes a path having the hold error; and inserting a delay cell in the specified layout block to adjust the hold error.

15. A method correcting a timing error, comprising: comparing delay times of a plurality of cells in a plurality of layout blocks, wherein each of the plurality cells has a tolerance for when a timing error occurs;

matching the tolerance of the plurality of cells with a worst condition; and inserting a delay cell in one of the plurality of layout blocks within a range of the matched tolerance of the plurality of cells to adjust timing error.

\* \* \* \* \*